(12) United States Patent
Goshi

(10) Patent No.: US 12,740,362 B2
(45) Date of Patent: Sep. 15, 2026

(54) SUBSTRATE PROCESSING APPARATUS AND SUBSTRATE PROCESSING METHOD

(71) Applicant: Tokyo Electron Limited, Tokyo (JP)

(72) Inventor: Gentaro Goshi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 129 days.

(21) Appl. No.: 18/935,536

(22) Filed: Nov. 3, 2024

(65) Prior Publication Data

US 2025/0149353 A1 May 8, 2025

(30) Foreign Application Priority Data

Nov. 8, 2023 (JP) ................................ 2023-190954

(51) Int. Cl.
*H10P 72/00* (2026.01)
*H10P 70/00* (2026.01)

(52) U.S. Cl.
CPC .......... *H10P 72/0404* (2026.01); *H10P 70/80* (2026.01); *H10P 72/0402* (2026.01); *H10P 72/0408* (2026.01)

(58) Field of Classification Search
CPC ............. H10P 72/0404; H10P 72/0402; H10P 72/0408; H10P 72/0414; H10P 72/0431; H10P 70/80
See application file for complete search history.

(56) References Cited

U.S. PATENT DOCUMENTS

2020/0020550 A1* 1/2020 Goshi ................. H10P 72/0408
2022/0301895 A1* 9/2022 Gosho ................. H10P 72/0408
2024/0410650 A1* 12/2024 Ma .......................... F26B 5/005
2025/0087501 A1* 3/2025 Goshi ................. H10P 72/0416

FOREIGN PATENT DOCUMENTS

WO 2023/013435 A1 2/2023

* cited by examiner

*Primary Examiner* — Kelsey E Cary
(74) *Attorney, Agent, or Firm* — Venjuris, P.C.

(57) ABSTRACT

A controller of a substrate processing apparatus executes: a first process in which a processing fluid is supplied to a processing container in a first period until a pressure in the processing container is increased and the processing fluid in the processing container reaches a supercritical state; a second process in which the processing fluid is supplied to the processing container at a flow rate larger than a flow rate of the processing fluid supplied to the first fluid ejector in the first process, in a second period; and a density adjustment process in which after ending of the first process and before starting of the second process, the density adjustment mechanism makes a difference between a density of the processing fluid present in the upstream region of a second opening/closing valve and a density of the processing fluid present in the processing container smaller than a predetermined threshold.

20 Claims, 10 Drawing Sheets

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2023-190954, filed on Nov. 8, 2023, with the Japan Patent Office, the disclosure of which is incorporated herein in its entirety by reference.

TECHNICAL FIELD

The present disclosure relates to a substrate processing apparatus and a substrate processing method.

BACKGROUND

In manufacturing semiconductor devices that forms a stacked structure of integrated circuits on the surface of a substrate such as a semiconductor wafer, liquid processing such as chemical cleaning or wet etching is performed. In order to more reliably suppress pattern collapse that is becoming increasingly fine in recent years, a drying method using a processing fluid in a supercritical state has been used in a drying process that is a final step of liquid processing (see, e.g., International Patent Pamphlet No. WO 2023/013435).

SUMMARY

According to one embodiment of the present disclosure, a substrate processing apparatus includes: a processing container that process a substrate using a processing fluid in a supercritical state; a processing fluid supply that supplies the processing fluid to the processing container; and a controller. The processing fluid supply includes: a first fluid ejector that ejects the processing fluid into the processing container, a second fluid ejector that ejects the processing fluid into the processing container, a first supply line that supplies the processing fluid to the first fluid ejector, a first opening/closing valve provided in the first supply line, a second supply line that supplies the processing fluid to the second fluid ejector, a second opening/closing valve provided in the second supply line, and a density adjustment mechanism capable of adjusting a density of the processing fluid present on the upstream side of the second opening/closing valve in the second supply line. The controller is configured to control the substrate processing apparatus so as to execute at least a first process in which the first opening/closing valve is opened and the second opening/closing valve is closed to supply the processing fluid to the first fluid ejector through the first supply line in a first period until a pressure in the processing container is increased and the processing fluid in the processing container reaches a supercritical state after supplying of the processing fluid to the processing container is started; at least a second process in which the first opening/closing valve is closed and the second opening/closing valve is opened to supply the processing fluid to the second fluid ejector through the second supply line at a flow rate larger than a flow rate of the processing fluid supplied to the first fluid ejector from the first supply line in the first period, in a second period after the processing fluid in the processing container has reached the supercritical state; and a density adjustment process in which after ending of the first supply period, before starting of the second supply period, the density adjustment mechanism makes a difference between an intra-line density and an intra-container density smaller than a predetermined threshold, the intra-line density being defined as a density of the processing fluid present in an upstream region of the second opening/closing valve in the second supply line, and the intra-container density being defined as a density of the processing fluid present in the processing container.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
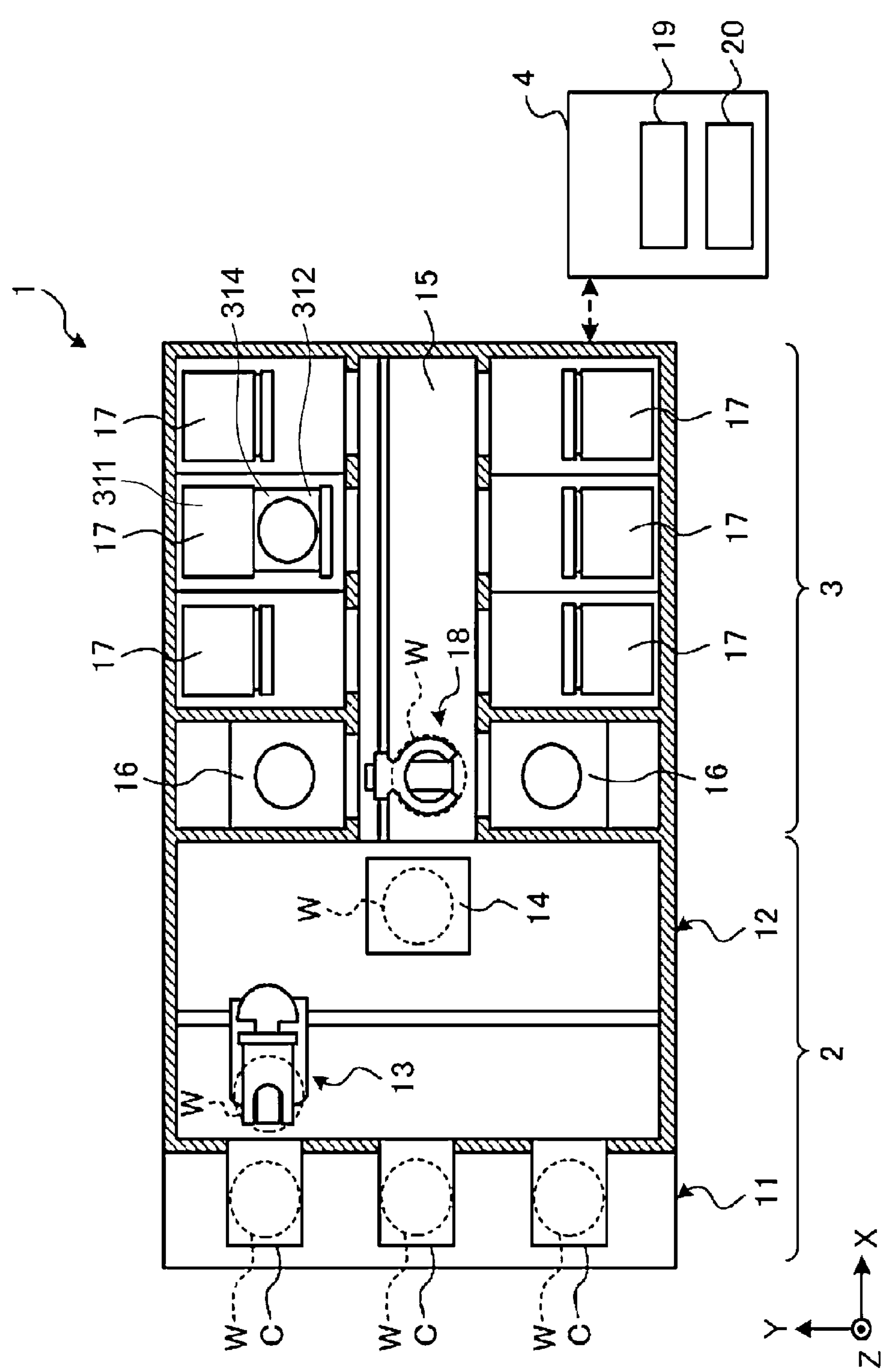
FIG. 1 is a cross-sectional view illustrating the schematic configuration of a substrate processing system according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a substrate processing method and a substrate processing apparatus according to the disclosure of the present application will be described in detail with reference to accompanying drawings. The present disclosure is not limited by the embodiments to be described below. Also, it should be noted that the drawings are schematic, and the dimensional relationship between individual elements, and the ratio of each element may be different from actual ones in some cases. Furthermore, in some cases, in the drawings, parts whose dimensional relationships or ratios are different from each other may be included.

<Outline of Substrate Processing System>

First, descriptions will be made on a schematic configuration of a substrate processing system 1 according to an embodiment, with reference to FIG. 1. FIG. 1 is a view illustrating a schematic configuration of the substrate processing system 1 according to the embodiment. Hereinafter, in order to clarify the positional relationship, an X-axis, a Y-axis, and a Z-axis which are orthogonal to each other are defined, and the positive direction of the Z axis is set as a vertical upward direction.

As illustrated in FIG. 1, the substrate processing system 1 includes a loading/unloading station 2, and a processing station 3. The substrate processing system 1 is an example of a substrate processing apparatus. The loading/unloading station 2 and the processing station 3 are provided adjacent to each other.

The loading/unloading station 2 includes a carrier placement section 11, and a transport section 12. In the carrier placement section 11, a plurality of carriers C accommodating a plurality of semiconductor wafers W (hereinafter, referred to as "wafers W") in a horizontal state is placed. The wafer W is an example of a substrate.

The transport section 12 is provided adjacent to the carrier placement section 11, and includes, therein, a substrate conveyance device 13, and a transfer unit 14. The substrate conveyance device 13 includes a wafer holding mechanism that holds wafers W. Also, the substrate conveyance device 13 is capable of moving in the horizontal direction and the vertical direction and rotating around the vertical axis, and transfers the wafers W to/from the carriers C/the transfer unit 14 by using the wafer holding mechanism.

The processing station 3 is provided adjacent to the transport section 12. The processing station 3 includes a transport section 15, a plurality of liquid processing units 16, and a plurality of supercritical drying units 17. The liquid processing units 16 and the supercritical drying units 17 are provided side by side on both side of the transport section 15. The arrangement and number of the liquid processing units 16 and the supercritical drying units 17 are not limited to those illustrated in FIG. 1.

The transport section 15 includes, therein, a substrate conveyance device 18. The substrate conveyance device 18 includes a wafer holding mechanism that holds wafers W. Also, the substrate conveyance device 18 is capable of moving in the horizontal direction and the vertical direction and rotating around the vertical axis, and transfers the wafers W from/to the transfer unit 14, the liquid processing unit 16 and the supercritical drying unit 17 by using the wafer holding mechanism.

The liquid processing unit 16 performs a series of liquid processes (such as wet etching processing using a chemical liquid, cleaning processing, and rinse processing) on the wafer W, and then, performs protective liquid film forming processing in a final step so as to form a protective liquid film of IPA, etc. The configuration of the liquid processing unit 16 will be described below.

The supercritical drying unit 17 performs a supercritical drying process on the wafer W having a surface on which the protective liquid film has been formed by the liquid processing unit 16. A configuration example of the supercritical drying unit 17 will be described below.

Also, the substrate processing system 1 includes a control device 4. The control device 4 is, for example, a computer, and includes a controller 19 and a storage 20.

The controller 19 includes a microcomputer or various circuits having a central processing unit (CPU), a read only memory (ROM), a random access memory (RAM), an input/output port, etc. The CPU of such a microcomputer reads and executes a program stored in the ROM to realize the control to be described below.

Such a program may be recorded in a computer-readable recording medium and may be installed to the storage 20 of the control device 4 from the recording medium. Examples of the computer-readable recording medium include hard disks (HD), flexible disks (FD), compact discs (CD), magnetic optical discs (MO), and memory cards.

The storage 20 is realized by, for example, a semiconductor memory device such as a RAM or a flash memory, or a storage device such as a hard disk or an optical disc.

In the substrate processing system 1 configured as described above, first, the substrate conveyance device 13 of the loading/unloading station 2 takes out a wafer W from the carrier C placed on the carrier placement section 11, and places the extracted wafer W on the transfer unit 14. The wafer W placed on the transfer unit 14 is taken out of the transfer unit 14 by the substrate conveyance device 18 of the processing station 3 and is carried into the liquid processing unit 16.

The wafer W carried into the liquid processing unit 16 is subjected to predetermined liquid processing by the liquid processing unit 16, and then is carried out of the liquid processing unit 16 by the substrate conveyance device 18 in a state where a protective liquid film of IPA, etc. is formed on the surface. The wafer W carried out of the liquid processing unit 16 is carried into the supercritical drying unit 17 by the substrate conveyance device 18 and is subjected to a supercritical drying process by the supercritical drying unit 17.

The wafer W, that has been subjected to substrate processing by the supercritical drying unit 17, is carried out of the supercritical drying unit 17 by the substrate conveyance device 18 and is placed on the transfer unit 14. Then, the processed wafer W placed on the transfer unit 14 is returned to the carrier C of the carrier placement section 11 by the substrate conveyance device 13.

<Configuration of Liquid Processing Unit>

Next, the configuration of the liquid processing unit 16 will be described with reference to FIG. 2. The liquid processing unit 16 is configured as a single-wafer type liquid processing unit. As for the liquid processing unit 16 itself, a unit having a conventionally known configuration may be used, and an example thereof will be briefly described below.

Figure 2:
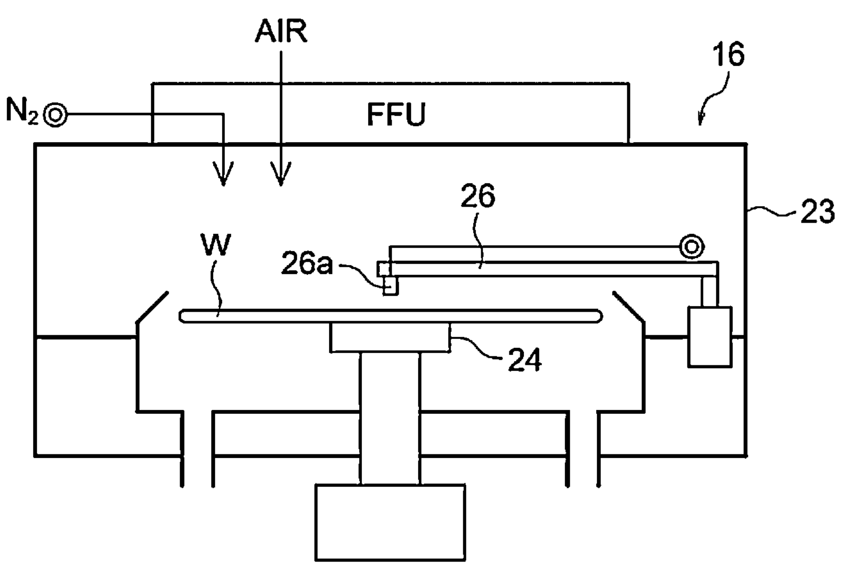
FIG. 2 is a schematic sectional view illustrating an example of the configuration of a liquid processing unit incorporated in the substrate processing system of FIG. 1.
Figure 2:
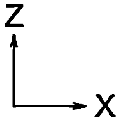

As illustrated in FIG. 2, the liquid processing unit 16 has a wafer holding mechanism 24 disposed within an outer chamber 23 that forms a processing space. The wafer holding mechanism 24 is configured to hold the wafer W in a horizontal position and rotate the wafer W around the vertical axis.

In the liquid processing unit 16, processing liquids (e.g., chemical liquid, rinsing liquid, IPA, etc.) required for liquid processing are sequentially supplied from a nozzle **26*a* so as to perform liquid processing on the surface of the wafer W (a device formation surface). The nozzle 26*a* is supported by a nozzle arm 26 and is located above the rotating wafer W. Although only one nozzle arm 26 and only one nozzle 26*a* are illustrated in FIG. 2**, these may be provided as many as necessary.

In the final step of liquid processing, IPA is supplied to the surface of the wafer W from the nozzle **26*a*** for supplying IPA (a protective liquid), and the liquid that has covered the surface of the wafer W so far (usually deionized water (DIW) as a rinsing liquid) is replaced with IPA. Thereafter, the flow rate of IPA supplied from the nozzle and the rotation speed of the wafer W are adjusted, so that the liquid film thickness of the IPA covering the surface of the wafer W is adjusted. Then, the ejection of the IPA from the nozzle is stopped and the rotation of the wafer W is stopped. Accordingly, the surface of the wafer W is covered with a protective liquid film having a desired film thickness.

As for the processing liquid (the protective liquid) for forming the protective liquid film, at present, in most cases, IPA (isopropyl alcohol) is used. As for the protective liquid, a mixed liquid of a low-hydric alcohol (e.g., ethanol, methanol, etc.) other than IPA, and a liquid having a different polarity from that of the low-hydric alcohol may also be used. The protective liquid is a liquid that has a high affinity with $CO_2$ (carbon dioxide) used as a processing fluid in a supercritical drying process.

<Configuration of Supercritical Drying Unit>

Next, the configuration of the supercritical drying unit 17 will be described with reference to FIG. 3 to FIG. 5. The supercritical drying unit 17 is used for performing a supercritical drying process. In the supercritical drying process, the substrate having a protective liquid film (here, IPA) formed on its surface is dried using a processing fluid in a supercritical state.

Figure 3:
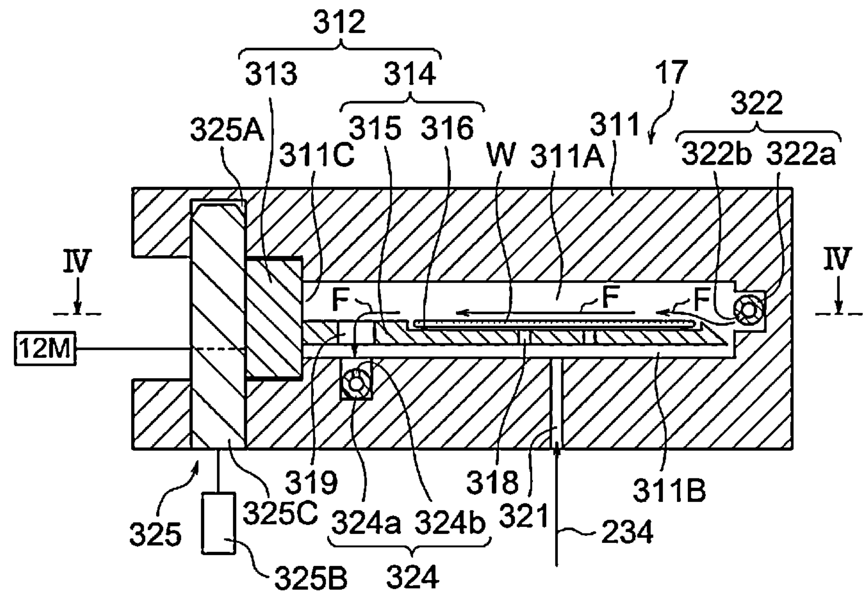
FIG. 3 is a schematic longitudinal sectional view illustrating an example of the configuration of a supercritical drying unit incorporated in the substrate processing system of FIG. 1.
Figure 3:
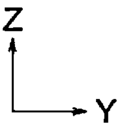
Figure 4:
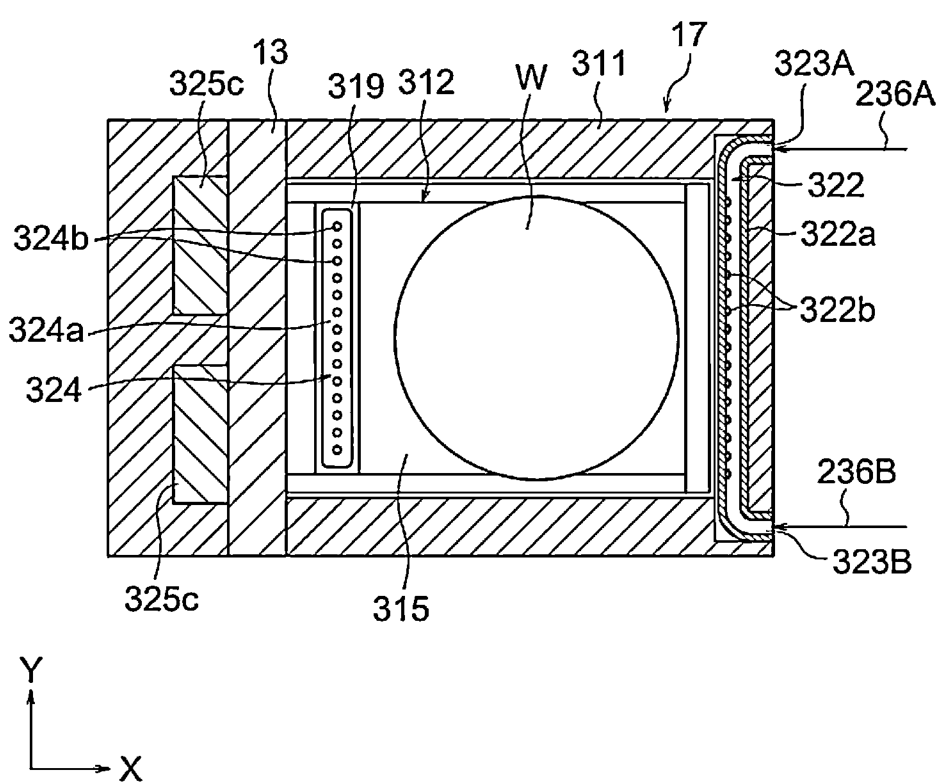
FIG. 4 is a schematic cross-sectional view of the supercritical drying unit taken along IV-IV in FIG. 3.

As illustrated in FIG. 3 and FIG. 4, the supercritical drying unit 17 includes a processing container 311, and a substrate holding tray 312 (hereinafter, simply referred to as "a tray 312") that holds the wafer W within the processing container 311.

The tray 312 includes a lid 313 that closes an opening 311C provided on the side wall of the processing container 311, and a substrate holder 314 that is integrally connected to the lid 313 and extends in the horizontal direction. The substrate holder 314 includes a plate 315, and a plurality of support pins 316 provided on the upper surface of the plate 315. The wafer W is placed in a horizontal position on the support pins 316 with its surface (a surface on which a device or a pattern is formed) facing upwards. When the wafer W is placed on the support pins 316, a gap 17 is formed between the upper surface of the plate 315 and the lower surface (rear surface) of the wafer W.

The plate 315 is formed with a plurality of through holes 318, and the through holes 318 vertically pass through the plate 315. The through holes 318 serve to allow fluidical communication between the upper space and the lower space of the plate 315, and to allow lift pins (not illustrated) to pass through the through holes 318. The lift pins mediate the transfer of the wafer W between the substrate conveyance device 18 (see e.g., FIG. 1) and the plate 315.

The tray 312 may be moved in the horizontal direction (Y direction) between a closed position and an open position by a tray moving mechanism 312M roughly illustrated in FIG. 3. When the tray 312 is in the closed position, the substrate holder 314 is located within the internal space of the processing container 311, and the lid 313 closes the opening of the side wall of the processing container 311. When the tray 312 is in the open position, the substrate holder 314 is outside the processing container 311 (see e.g., FIG. 1), and the wafer W may be transferred between the substrate holder 314 and a substrate transfer arm (not illustrated) via lift pins (not illustrated).

When the tray 312 is in the closed position (see e.g., FIG. 3 and FIG. 4), the internal space of the processing container 311 is divided by the plate 315 into an upper space 311A above the plate 315 (in which the wafer W is disposed) and a lower space 311B below the plate 315. However, the upper space 311A and the lower space 311B are not completely separated. The upper space 311A and the lower space 311B fluidically communicate with each other via the through holes 318, and via a gap between the periphery of the plate 315 and the inner wall surface of the processing container 311.

The processing container 311 is provided with a first fluid ejector 321 and a second fluid ejector 322. The first fluid ejector 321 and the second fluid ejector 322 eject a processing fluid supplied from a supply source 230 of a supercritical fluid (a processing fluid in a supercritical state) (in this example, carbon dioxide (hereinafter, also simply referred to as "$CO_2$")), to the internal space of the processing container 311.

The first fluid ejector 321 is provided below the plate 315 of the tray 312 in the closed position. The first fluid ejector 321 ejects $CO_2$ (processing fluid) into the lower space 311B toward the lower surface of the plate 315 (upwards). The first fluid ejector 321 may be composed of a through hole formed in the bottom wall of the processing container 311. The first fluid ejector 321 may be a nozzle body attached to a bottom wall of the processing container 311.

The second fluid ejector 322 is provided to be located on the lateral side of the wafer W placed on the substrate holder 314 of the tray 312 in the closed position (the advanced position in the positive Y direction). The second fluid ejector 322 supplies $CO_2$ into the upper space 311A. In the illustrated embodiment, the second fluid ejector 322 is provided on the side wall of the processing container 311 on the opposite side of the lid 313.

In the illustrated embodiment, the second fluid ejector 322 is formed as a so-called "bar nozzle". Specifically, the second fluid ejector 322 is formed by punching a plurality of ejection ports **322*b* in a pipe 322*a* extending in the width direction (the X direction) of the wafer W. The ejection ports 322*b* are arranged at equal intervals in, for example, the X direction. Each of the ejection ports 322*b* ejects $CO_2$ into the upper space 311A, in a horizontal direction or a slightly diagonally downward direction toward the opening 311**C.

The configuration of the second fluid ejector 322 is not limited to the above. The second fluid ejector 322 may be configured to eject supercritical $CO_2$ such that a supercritical $CO_2$ laminar flow flowing from one side of the wafer toward the other side in one direction (the Y direction in FIG. 4) is formed near the surface of the wafer W, and may be configured to eject supercritical $CO_2$ such that the flow velocity of supercritical $CO_2$ becomes approximately uniform over the entire area of the wafer. Thus, as for the configuration of the second fluid ejector 322, in most cases, a configuration similar to that illustrated in the drawing is employed. The second fluid ejector 322 may be formed by punching an X-direction extending hole inside an X-direction extending elongated block body, and punching a plurality of ejection ports in the block body. The ejection ports communicate with the hole and extend substantially in the Y direction. Regardless of the configuration to be adopted, a certain space (the internal space of the pipe **322*a* in the illustrated example) exists immediately upstream of the ejection ports of the second fluid ejector 322**. In the present disclosure, a technique related to inhibition of particles resulting from contaminants that have entered or have accumulated in this (internal) space will be described in detail later.

The processing container 311 is further provided with a fluid discharge portion 324 that discharges a processing fluid from the internal space of the processing container 311. The fluid discharge portion 324 may have substantially the same configuration as the second fluid ejector 322. Like the second fluid ejector 322, the fluid discharge portion 324 may be formed by punching a plurality of discharge ports 324*b* in a horizontally extending pipe 324*a*. The discharge ports 324*b* are arranged at equal intervals in, for example, the X direction. Each of the discharge ports 324*b* faces upwards, and faces a long hole 319 of the plate 315.

In the illustrated embodiment, the fluid discharge portion 324 is provided in a recess formed in the bottom wall of the processing container 311 near the opening 311C. As indicated by the arrow F in FIG. 3, $CO_2$ flows through a region above the wafer W in the upper space 311A, and then flows into the lower space 311B via a communication passage (or the through hole 319 formed in the plate 315) provided in the periphery of the plate 315 and then is discharged from the fluid discharge portion 324.

The arrangement of the second fluid ejector 322 and the fluid discharge portion 324 is not limited to that illustrated in the drawing. The second fluid ejector 322 and the fluid discharge portion 324 may be arranged at any locations as long as $CO_2$ supplied from the second fluid ejector 322 into the processing container 311 passes through a region above substantially the entire surface of the wafer W substantially in the horizontal direction and then is discharged from the fluid discharge portion 324.

The supercritical processing unit 17 is provided with a locking mechanism 325 that maintains the tray 312 in a closed position even if the inside pressure of the processing container 311 becomes high. The locking mechanism 325 has a latch-type locking member 325C that is raised and lowered by a lifting mechanism 325B within a guide hole 325A formed in the processing container 311.

Next, a supply/discharge system for supplying and discharging carbon dioxide (hereinafter, also referred to as "$CO_2$" for the sake of simplicity of description) to/from the processing container 311 of the supercritical drying unit 17 will be described with reference to FIG. 5.

Figure 5:
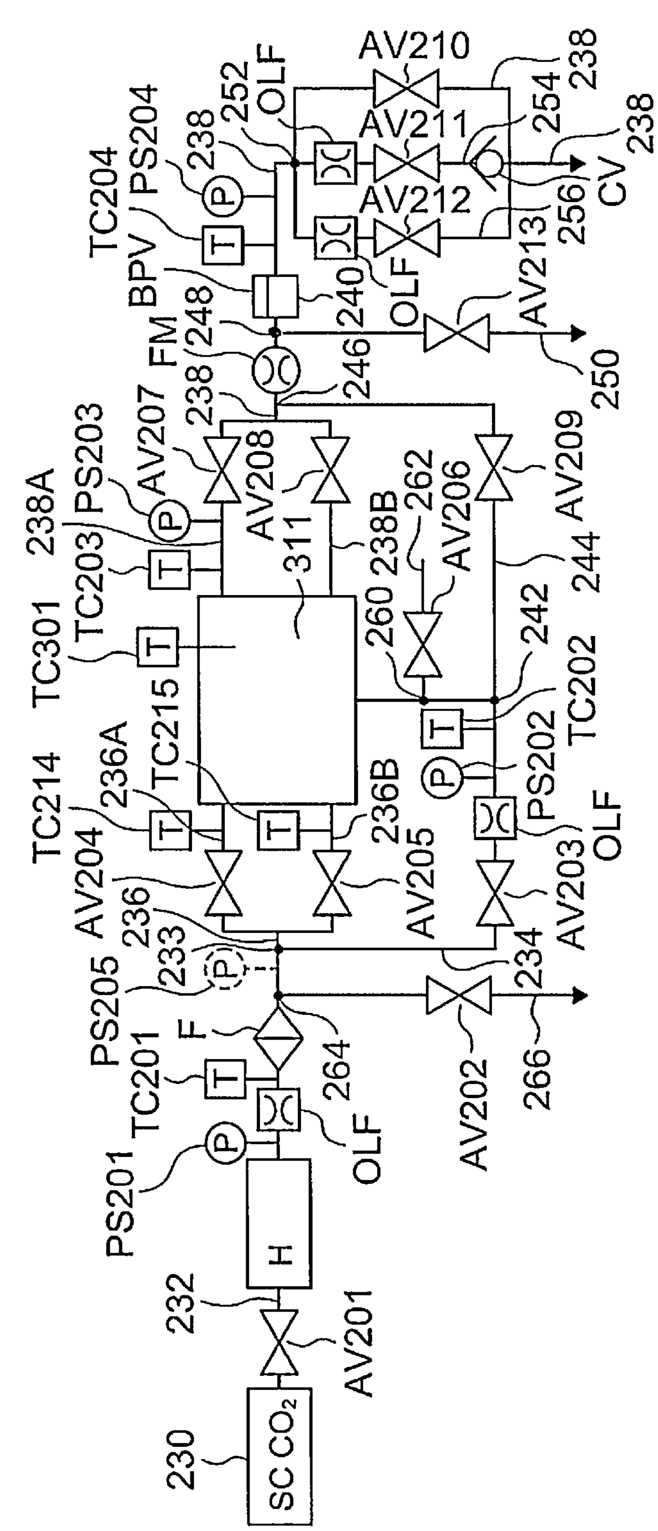
FIG. 5 is a piping system diagram illustrating an example of a supply/discharge system connected to a processing container of the supercritical drying unit illustrated in FIG. 3 and FIG. 4.

In the piping system diagram illustrated in FIG. 5, the member indicated by T surrounded by a square is a temperature sensor. Temperature sensors are denoted by reference signs in the "T+three-digit number" form such that they are distinguished from each other. The member indicated by P surrounded by a circle is a pressure sensor. Individual pressure sensors are denoted by reference signs in the "P+three-digit number" form such that they are distinguished from each other. The member denoted by the symbol OLF is an orifice (fixed throttle), and the pressure of $CO_2$ flowing through the orifice is reduced. The member denoted by the symbol F is a filter, and contaminants included in $CO_2$, such as particles, are removed. The member denoted by the symbol CV is a check valve. The member denoted by a reference sign FM is a flow meter. The member indicated by H surrounded by a square is a heater for regulating the temperature of $CO_2$. The member denoted by a reference sign in the "AV+three-digit number" form is an opening/closing valve.

The supercritical processing apparatus includes the supercritical fluid supply device 230. In the present embodiment, the supercritical fluid is $CO_2$ in a supercritical state (hereinafter, also referred to as "supercritical $CO_2$"). The supercritical fluid supply device 230 has a conventionally known configuration including, for example, a carbon dioxide gas cylinder, a pressure pump, a heater, etc. The supercritical fluid supply device 230 has the ability to send supercritical $CO_2$ at such a pressure (e.g., about 20 MPa) that the pressure in the processing container 311 is reliably raised to a supercritical state guarantee pressure (specifically, e.g., about 16 MPa) to be described below.

A main supply line 232 is connected to the supercritical fluid supply device 230. $CO_2$ in a supercritical state flows out of the supercritical fluid supply device 230 and into the main supply line 232 but may become gaseous due to subsequent expansion (pressure drop) or temperature change. In the present specification, a member called a "line" may be constituted by a pipe (a piping member).

The main supply line 232 diverges into a first supply line 234 and a second supply line 236 at a branch point 233. The first supply line 234 is connected to the first fluid ejector 321 of the processing container 311.

The second supply line 236 is connected to the second fluid ejector 322 of the processing container 311. When the second fluid ejector 322 is composed of the horizontally extending pipe 322*a* through which the ports 322*b* are formed as illustrated in FIG. 3 and FIG. 4, the second supply line 236 diverges into two second branch supply lines 236A and 236B on the downstream side of the branch point 233. The downstream ends of the second branch supply lines 236A and 236B are connected to both ends of the pipe 322*a* (indicated by reference signs 323A and 323B in FIG. 4).

A discharge line 238 is connected to the fluid discharge portion 324 of the processing container 311. When the fluid discharge portion 324 is composed of the horizontally extending pipe through which the plurality of ports is formed, like the second fluid ejector 322, the fluid discharge portion 324 is composed of branch discharge lines 238A and 238B connected to both ends of this pipe. These branch discharge lines 238A and 238B join together to form a single discharge line 238.

A pressure adjustment valve 240 is provided in the discharge line 238. By adjusting the opening degree of the pressure adjustment valve 240, the primary side pressure of the pressure adjustment valve 240 may be adjusted, and thus the pressure inside the processing container 311 may be adjusted. A valve designed as a back pressure valve (BPV) may be used as the pressure adjustment valve 240.

The control device 4 (or its subordinate controller) schematically illustrated in FIG. 1 performs feedback control on the opening degree of the pressure adjustment valve 240 on the basis of a deviation between a measured value PV and a set value SV of the pressure inside the processing container 311 so that the pressure within the processing container 311 is maintained at a set value. A pressure sensor PS203 provided between the processing container 311 and an opening/closing valve AV207 provided in the discharge line 238 (the branch discharge line 238A) may detect a pressure substantially equal to the pressure inside the processing container 311. Therefore, in the feedback control, the detection value of the pressure sensor PS203 may be used as the measured value PV. It does not matter if the pressure within the processing container 311 is directly measured by a pressure sensor provided within the processing container 311.

At a branch point 242 set on the first supply line 234, a bypass line 244 diverges from the first supply line 234. The bypass line 244 is connected to the discharge line 238, at a confluence point 246 set on the discharge line 238. The confluence point 246 is present on the upstream side of the pressure adjustment valve 240.

A branch discharge line 250 diverges from the discharge line 238, at a branch point 248 set on the discharge line 238 on the upstream side of the pressure adjustment valve 240. The downstream end of the branch discharge line 250 is open to, for example, the atmospheric space outside the supercritical processing apparatus or is connected to a factory exhaust duct.

At a branch point 252 set on the discharge line 238, two branch discharge lines 254 and 256 diverge from the discharge line 238. Downstream ends of the branch discharge lines 254 and 256 join the discharge line 238 again. The downstream end of the discharge line 238 is connected to, for example, a fluid recovery device (not illustrated). Useful components (e.g., IPA (isopropyl alcohol)) included in $CO_2$ collected by the fluid recovery device are appropriately separated and re-used.

Between the branch point 242 and the processing container 311, a purge gas supply line 262 is connected to a confluence point 260 set on the first supply line 234. Purge gas (e.g., nitrogen gas) may be supplied to the processing container 311 via the purge gas supply line 262.

An exhaust line 266 branches at a branch point 264 set on the main supply line 232 immediately upstream of the branch point 233.

Next, descriptions will be made on an embodiment of a drying method (a substrate processing method) executed using the above-mentioned supercritical processing apparatus, with reference to FIGS. 6A to 6E. The drying method to be described below is automatically executed under the control of the control device 4 on the basis of the processing recipe and the control program stored in the storage 20 of the control device 4.

In FIGS. 6A to 6E, a black-colored opening/closing valve is in a closed state, and an uncolored opening/closing valve is in an open state. A line where high-pressure $CO_2$ exists is indicated by a thick solid line.

A wafer W, which has been subjected to liquid processing by the liquid processing unit 16 and has a protective liquid film of IPA formed on the surface thereof, is placed on the plate 315 of the tray 312 waiting at the substrate transfer position, by the substrate conveyance device 18 illustrated in FIG. 1. When the tray 312 on which the wafer W is placed is moved to the processing position, a sealed processing space is formed within the processing container 311, and the wafer W is located in the processing space.

[Pressurization Process (First Process)]

Next, a pressurization process is performed. The pressurization process includes an initial deceleration pressurization step, and a normal pressurization step subsequent to the deceleration pressurization step.

An opening/closing valve AV213 may be always closed during the pressurization and circulation processes, and may be opened during the depressurization process. The opening/closing valve AV213 may be always closed from the start time of the pressurization process until the end time of the depressurization process, and may be opened at an appropriate timing as necessary. When the opening/closing valve AV213 is opened, gases may be exhausted without passing through the pressure adjustment valve 240. Thus, the exhaust or depressurization time may be shortened. Also, an opening/closing valve AV206 is also opened only when purging of the inside of the processing container 311 is performed. In the following description, descriptions are made on the assumption that the opening/closing valve AV206 and the opening/closing valve AV213 are always closed during processing of the wafer W.

<Deceleration Pressurization Step>

Figure 6A:
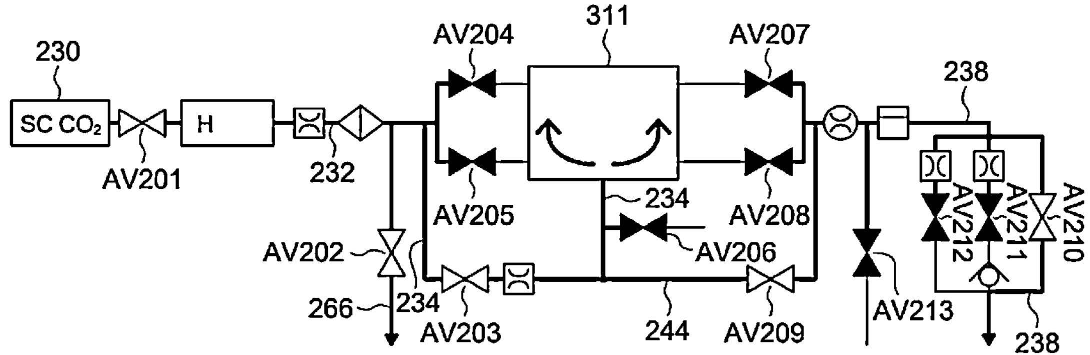
FIGS. 6A to 6E are views each illustrating an example of the state of the supply/discharge system in each process in a supercritical drying process.

First, as illustrated in FIG. 6A, opening/closing valves AV204, AV205, AV211, and AV212 are closed, and opening/closing valves AV201, AV202, AV203, AV209, and AV210 are opened. In this deceleration pressurization step, the pressure adjustment valve 240 may be fixed to an appropriate opening degree, for example, the same opening degree as the initial opening degree in the circulation process to be described below. A part of $CO_2$ in a supercritical state sent from the supercritical fluid supply device 230 to the main supply line 232 is discharged from the exhaust line 266, and the remainder of $CO_2$ flows into the first supply line 234 and a part thereof flows into the processing container 311 via the first fluid ejector 321. Also, a part of $CO_2$ that has flowed through the first supply line 234 does not flow toward the processing container 311 but flows into the discharge line 238 via the bypass line 244, and then is discarded in the factory exhaust duct or is recovered for re-use after flowing through the discharge line 238.

Immediately after the deceleration pressurization step starts, the pressure of $CO_2$ in a supercritical state sent from the supercritical fluid supply device 230 significantly drops when flowing into the relatively large-volume processing container 311 in a normal pressure state. That is, at the beginning of introduction of $CO_2$ into the processing container 311, since the pressure of $CO_2$ within the processing container 311 is lower than a critical pressure (about 8 MPa), $CO_2$ is in a gaseous state. A difference between the pressure in the first supply line 234 and the pressure in the processing container 311 in a normal pressure state is very large. Thus, immediately after the deceleration pressurization step starts, $CO_2$ flows into the processing container 311 at a high flow velocity. When $CO_2$ (especially, $CO_2$ in a gaseous state at a high speed) collides with the wafer W or flows near the wafer W, there is a risk that a collapse (local evaporation or fluctuation) may occur in the IPA puddle on the periphery of the wafer W, causing a pattern collapse.

In the present embodiment, in the deceleration pressurization step, that is, at the beginning of introduction of $CO_2$ into the processing container 311, a part of $CO_2$ flowing through the main supply line 232 is released to the exhaust line 266 (release operation A), and a part of $CO_2$ flowing through the first supply line 234 is released to the bypass line 244 (release operation B). Thus, $CO_2$ is suppressed from flowing into the processing container 311 at a high flow velocity.

Furthermore, in the present embodiment, since an orifice OLF is provided in the first supply line 234, the flow velocity of $CO_2$ flowing into the processing container 311 from the first fluid ejector 321 is lower than that in the case where there is no orifice. Thus, it is possible to suppress a pattern collapse caused by the above-mentioned mechanism.

A pattern collapse may occur due to the above-mentioned mechanism only at the beginning of introduction of $CO_2$ into the processing container 311. This is because the flow velocity of $CO_2$ flowing into the processing container 311 via the first fluid ejector 321 is gradually reduced as the internal pressure of the processing container 311 increases. Therefore, it is sufficient to execute the deceleration pressurization step for a relatively short period of time, for example, about 10 to 20 sec. Also, it is not necessary to perform release operations A and B throughout the entire period of the deceleration pressurization step, and the release operation A may be stopped first. Also, it doesn't matter if the opening/closing valve AV210 of the discharge line 238 is closed during the deceleration pressurization step.

<Normal Pressurization Step>

Figure 6B:
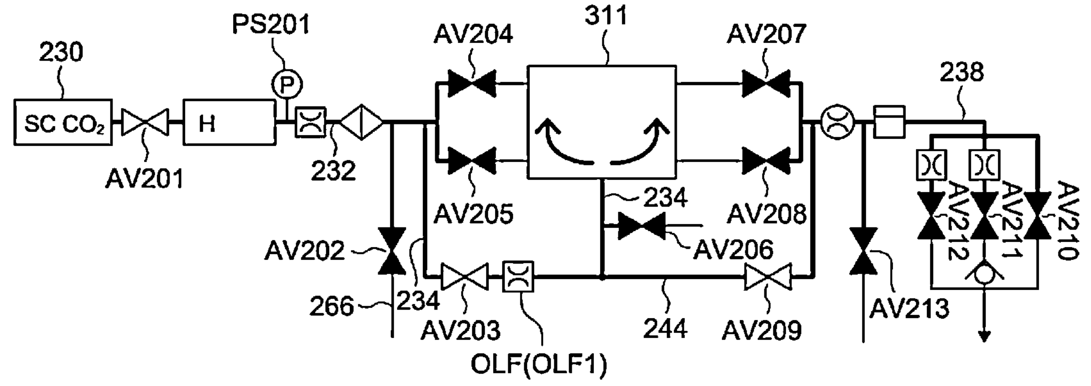

Next, as illustrated in FIG. 6B, the opening/closing valves AV202 and AV210 are also closed. This switching may be performed, for example, when the pressure inside the processing container 311 (e.g., the detection value of the pressure sensor PS203) exceeds a predetermined threshold. Alternatively, the switching may be performed when a predetermined time (e.g., about 10 sec as described above) has elapsed since the start of the deceleration pressurization step. In this normal pressurization step, for smooth transition to the circulation process to be described below, it is desirable to fix the opening degree of the pressure adjustment valve 240 to the initial opening degree in the circulation process to be described below.

With the above-mentioned switching of the opening/closing valves, $CO_2$, which has flowed into the discharge line 238 from the bypass line 244 and has been discharged through the discharge line 238, is blocked by the opening/closing valves AV210 to AV212. Also, the line 250 is also closed by the closed opening/closing valve AV213. Therefore, the lines 244, 238, 250, 254, and 256 are gradually filled with $CO_2$, and the pressure in the lines gradually increases. Then, the flow rate of $CO_2$ flowing from the first supply line 234 to the bypass line 244 is also reduced, and the pressure inside the processing container 311 gradually increases at a higher pressure rise rate than in the deceleration pressurization step.

When the pressure inside the processing container 311 exceeds a critical pressure (about 8 MPa) of $CO_2$, $CO_2$ present in the processing container 311 ($CO_2$ not mixed with IPA) becomes supercritical. When $CO_2$ in the processing container 311 becomes supercritical, IPA on the wafer W starts to dissolve in supercritical $CO_2$.

After the pressure inside the processing container 311 exceeds the critical pressure of $CO_2$, until a predetermined rise target pressure is reached, the above-mentioned normal pressurization step is continued. In the present embodiment, the rise target pressure is set to 16 MPa that is a pressure at which $CO_2$ in the processing container 311 is guaranteed to be maintained in a supercritical state (hereinafter, also referred to as "a supercritical state guarantee pressure" for the sake of simplicity) regardless of IPA concentration and temperature of the mixed fluid ($CO_2$+IPA) on the wafer W.

[Depressurization Process (Density Adjustment Process)]

Figure 6C:
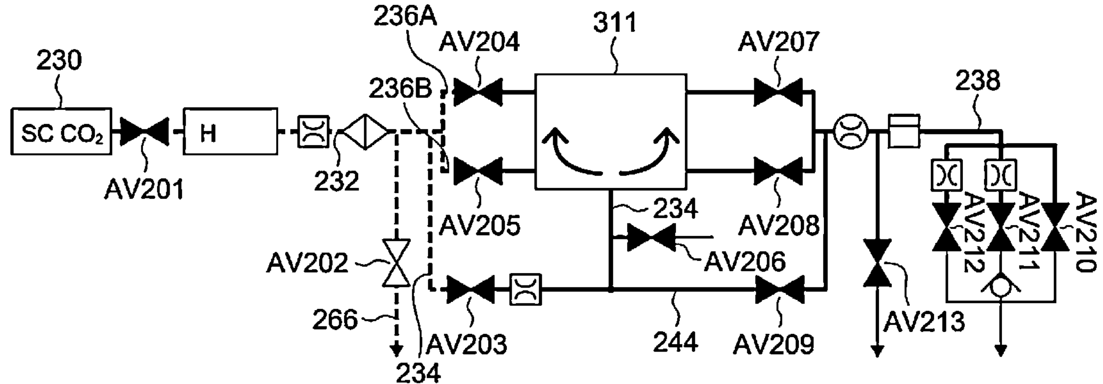

When it is confirmed by a pressure sensor (e.g., the pressure sensor PS203 in FIG. 5) that the pressure in the processing container 311 has reached the above-mentioned supercritical state guarantee pressure, as illustrated in FIG. 6C, in a state where all the opening/closing valves other than the opening/closing valve AV202 are closed, the opening/closing valve AV202 is opened for a short time (e.g., about 1 sec), so as to temporarily reduce the pressure in an upstream region of the opening/closing valves AV204 and AV205 of the second branch supply lines 236A and 236B and a region communicating therewith (a region indicated by the thick dashed line). The technical significance of this depressurization process will be described in detail later.

[Circulation Process (Second Process)]

Figure 6D:
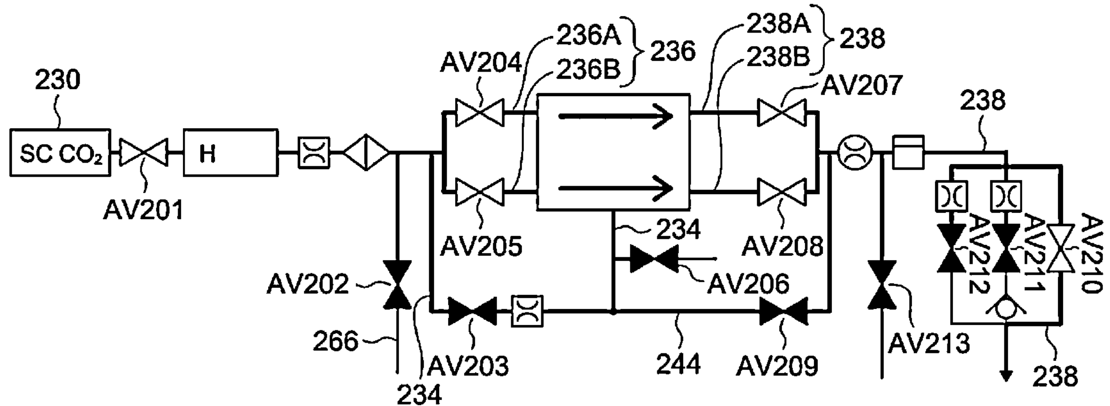

Next, as illustrated in FIG. 6D, the opening/closing valve AV202 is closed, and the opening/closing valves AV201, AV204, AV205, AV207, AV208, and AV210 are opened. An appropriate initial opening degree command signal is given to the pressure adjustment valve 240, and the opening degree control of the pressure adjustment valve 240 is switched to a feedback control to perform transition to a circulation process. The above-mentioned "initial opening degree" may be, for example, the same opening degree as the opening degree when the pressure inside the processing container 311 is stabilized at the above-mentioned supercritical state guarantee pressure during the circulation process. It is desirable that the opening/closing valve AV210 is opened simultaneously with or slightly after the opening of the opening/closing valves AV207 and AV208. With the above switching, $CO_2$ is supplied into the processing container 311 via the second supply line 236, the second branch supply lines 236A and 236B and the second fluid ejector 322.

In the circulation process, in a state where the pressure inside the processing container 311 is maintained at the above-described supercritical state guarantee pressure (16 MPa) by the feedback control of the pressure adjustment valve 240, the supercritical $CO_2$ supplied from the second fluid ejector 322 into the processing container 311 flows through the region above the substrate, and then is discharged from the fluid discharge portion 324. Here, a laminar flow of supercritical $CO_2$ that flows substantially in parallel with the surface of the wafer W is formed within the processing container 311. IPA in the mixed fluid (IPA+$CO_2$) on the surface of the wafer W exposed to the supercritical $CO_2$ laminar flow is gradually replaced with supercritical $CO_2$. Finally, almost all of IPA on the surface of the wafer W is replaced with supercritical $CO_2$.

The mixed fluid composed of IPA and supercritical $CO_2$, which is discharged from the fluid discharge portion 324, flows through the discharge line 238 and then is collected. IPA included in the mixed fluid may be separated and re-used. In the circulation process, the opening/closing valves AV211 and AV212 may be opened or closed according to a desired flow rate, etc.

[Discharge Process]

Figure 6E:
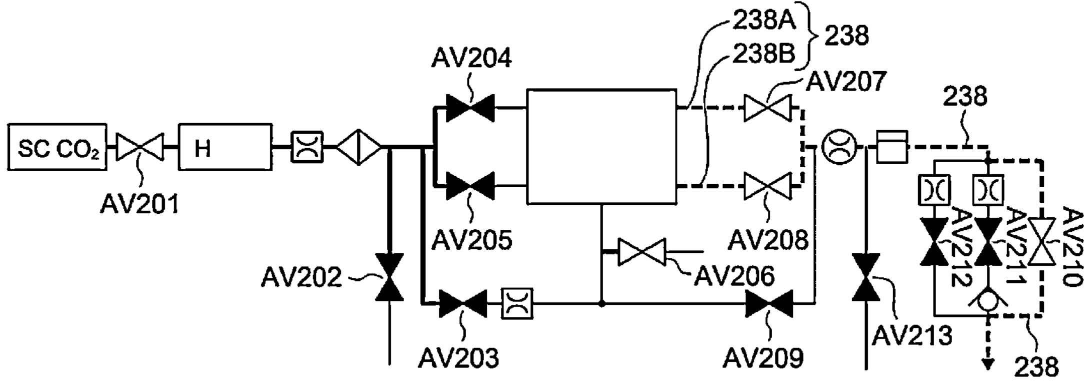

When the replacement of IPA with supercritical $CO_2$ is completed, as illustrated in FIG. 6E, the opening/closing valves AV204 and AV205 are closed, so that the supply of supercritical $CO_2$ to the processing container 311 is stopped, and the set pressure of the processing container 311 is lowered to normal pressure. Here, the opening/closing valve AV209 of the bypass line 244 may be opened. Accordingly, the opening degree of the pressure adjustment valve 240 is greatly increased (e.g., fully opened), and the pressure inside the processing container 311 is gradually reduced to normal pressure. Accordingly, the supercritical $CO_2$ in the pattern of the wafer W becomes gaseous and escapes from the inside of the pattern, and the gaseous $CO_2$ is gradually discharged from the processing container 311 (see the thick dashed line). The set pressure of the processing container 311 may not be lowered to normal pressure. Instead, a command signal for increasing the opening degree of the pressure adjustment valve 240 may be given to the pressure adjustment valve 240 from the controller 4. In the discharge process, the set pressure of the processing container 311 may be lowered to normal pressure in a stepwise manner. In this manner, the drying of the wafer W is ended.

[Unloading Process]

The plate 315 of the tray 312 on which the dried wafer W is placed comes out of the processing container 311 and moves to the substrate transfer position. The wafer W is taken out of the plate 315 by the substrate conveyance device 18 (FIG. 1) and is carried out of the supercritical drying unit 17. In this manner, a supercritical drying process on one wafer is ended.

[Detailed Description on Depressurization Process]

Next, the depressurization process (see e.g., FIG. 6C) performed between the pressurization process and the circulation process will be described in detail. As illustrated in FIG. 6B, immediately before the pressurization process (the normal pressurization step) ends, $CO_2$ is flowing from the main supply line 232 to the processing container 311 through the first supply line 234. Here, since the orifice OLF (this orifice is also called an "orifice OLF1" for convenience of explanation) is provided in the first supply line 234, a pressure drop occurs at the portion of the orifice OLF1. That is, the pressure in the upstream region of the orifice OLF1 (intra-line pressure) is higher than the pressure inside the processing container 311 (intra-container pressure). When the flowing of $CO_2$ through the orifice OLF1 is stopped, a pressure difference between the upstream region and the downstream region of the orifice OLF1 is gradually reduced, but does not immediately become zero. The pressure in the upstream region of the orifice OLF1 is slightly lower than, for example, 20 MPa that is a $CO_2$ delivery pressure of the supercritical fluid supply device 230. Here, the pressure detected by a pressure sensor PS201 is about 19 MPa (see also the graph in FIG. 7). Meanwhile, the pressure in the region downstream of the orifice OLF1 is a pressure approximately equal to the rise target pressure (16 MPa) of the processing container.

In some cases, contaminants may be contained (or dissolved) in the IPA liquid film on the wafer W. The contaminants may be those that have been attached to the wafer W since before the processing in the liquid processing unit 16, those that have been attached in the liquid processing unit 16, and those that have been attached during transportation. When the pressurization process is being performed, IPA in which contaminants are contained or dissolved escapes from the IPA liquid film on the wafer W, floats in the processing container 311, and enters the internal space of the pipe 322*a* of the second fluid ejector 322 (the pressure in this space is an approximately normal pressure at the start of the pressurization process). Also, as the processing of the wafer W is repeatedly performed in the processing container 311, the contaminants are attached to and accumulated on the inner wall of the pipe 322*a*. The accumulation of contaminants on the inner wall of the pipe 322*a* is unavoidable. When the pressurization process is being performed, $CO_2$ supplied to the processing container 311 also enters the inside of the pipe 322*a*. When the internal pressure of the pipe 322*a* increases in the later stage of the pressurization process and $CO_2$ reaches a critical state within the pipe 322*a*, at least a part of contaminants present inside the pipe 322*a* is dissolved in $CO_2$.

The amount of contaminants dissolved in supercritical $CO_2$ increases as the density of supercritical $CO_2$ increases (that is, as the pressure of supercritical $CO_2$ increases). Thus, the solubility of contaminants present inside the pipe 322*a*, in supercritical $CO_2$, is maximized in the final step of the pressurization process.

Here, it is assumed that the depressurization process is not performed and the pressurization process is followed by the circulation process. In this case, when the opening/closing valves AV204 and AV205 are opened, the high-pressure supercritical $CO_2$ (e.g., about 18 to 19 Mpa) on the upstream side flows into the pipe 322*a* having approximately the same pressure (e.g., about 16 Mpa) as the pressure inside the processing container 311. Accordingly, the $CO_2$ pressure (that is, the $CO_2$ density) in the pipe 322*a* suddenly increases. Then, a part of contaminants in the pipe 322*a*, which has not been dissolved in supercritical $CO_2$ so far, is dissolved ("additional dissolution"), and is ejected into the processing container 311. Furthermore, due to a large difference (about 2 to 3 MPa) between the pressure inside the pipe 322*a* and the pressure inside the processing container 311, $CO_2$ is vigorously sprayed from the ejection ports 322*b* of the pipe 322*a*. Here, the contaminants in the pipe 322*a* easily escape from the inside of the pipe 322*a* together with $CO_2$.

In the period immediately after the ejection from the pipe 322*a* is started, high-pressure $CO_2$ in the pipe 322*a* is ejected into the low-pressure processing container 311, so that the pressure of $CO_2$ suddenly drops. Accordingly, the solubility of contaminants in $CO_2$ is reduced, and contaminants dissolved in $CO_2$ are precipitated. There is a risk that the precipitated contaminants may adhere to the wafer W and contaminate the wafer W. In addition, after the circulation process starts, when $CO_2$ passes through the processing container 311 and stably flows at a relatively large flow rate, the pressure in the main supply line 232 is gradually reduced (see the lines PS201-1 and PS201-2 in FIG. 7). Thus, the large pressure difference between the internal space of the processing container 311 and the pipe 322*a* is eliminated. That is, the above-mentioned problem is a problem that may occur only at the beginning of the circulation process.

The above-mentioned problem may be solved by carrying out the above described depressurization process. First, by carrying out the depressurization process, the above-mentioned "additional dissolution" is less likely to occur. Since the difference between the pressure inside the processing container 311 and the pressure in the pipe 322*a* becomes small around the time of start of $CO_2$ ejection, $CO_2$ is suppressed from being vigorously sprayed from the ejection ports 322*b*, and contaminants are less likely to be precipitated from $CO_2$ ejected into the processing container 311 from the pipe 322*a*. Therefore, the possibility of contamination of the wafer W is reduced.

The depressurization process is performed such that as a result of carrying-out of the depressurization process, the pressure in the upstream region closest to the opening/closing valves AV204 and AV205 is higher than the pressure inside the processing container 311 by 2 MPa or less, preferably by 1 MPa or less. As described above, when the rise target pressure is set to 16 MPa, the depressurization process may be performed such that the pressure in the upstream region closest to the opening/closing valves AV204 and AV205 becomes, for example, about 17 MPa to 18 MPa. The pressure in the upstream region closest to the opening/closing valves AV204 and AV205 cannot be made lower than the pressure inside the processing container 311 because backflow of $CO_2$ may occur.

The depressurization process may be ended at a point in time when the detection value of the pressure sensor (e.g., the pressure sensor PS201 (see e.g., FIG. 5)) in the upstream region of the opening/closing valves AV204 and AV205 becomes lower than a predetermined value. A pressure sensor (e.g., a pressure sensor PS205 indicated by the dashed line in FIG. 5) may be provided at a position close to the opening/closing valves AV204 and AV205 compared to the pressure sensor PS201, and then the depressurization process may be ended at a point in time when the detection value of the pressure sensor becomes lower than a predetermined value (e.g., 17 MPa).

Figure 7:
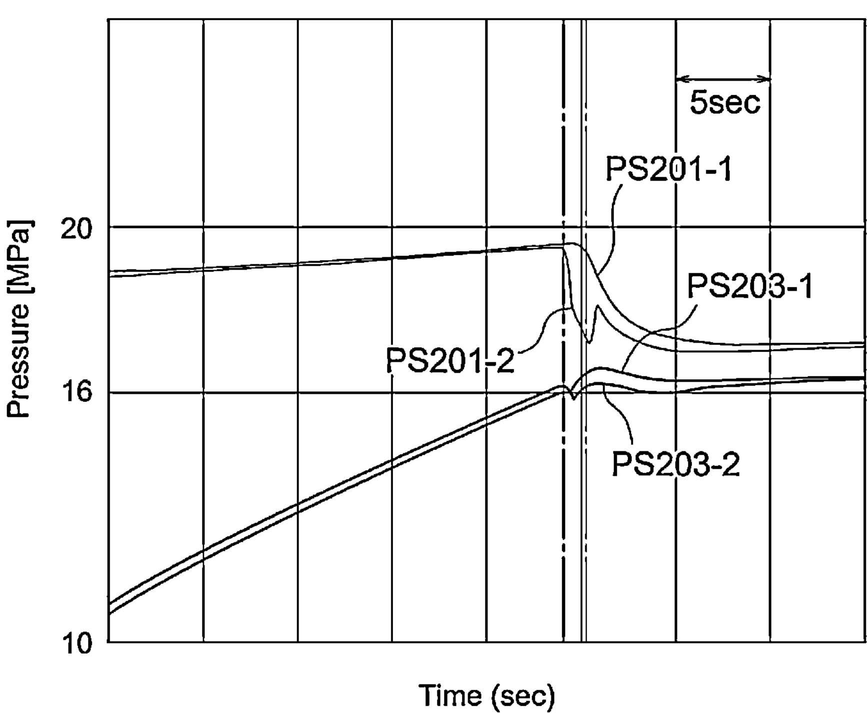
FIG. 7 is a graph illustrating an example of a density adjustment process (depressurization process) and a pressure change before and after the process.

The graph of FIG. 7 illustrates an example of transition of the detection value of the pressure sensor PS201 (corresponding to the upstream pressure of the opening/closing valves AV204 and AV205), and an example of transition of the detection value of the pressure sensor PS203 (corresponding to the pressure inside the processing container 311) before and after the depressurization process. The vertical axis of the graph is a detection pressure of a pressure sensor (unit: MPa), and the horizontal axis is time (in the graph, intervals of 5 seconds are illustrated). The lines PS201-1 and PS203-1 illustrate transitions of the detection values of the pressure sensors PS201 and PS203, respectively, in a case where the depressurization process is not performed (Comparative Example). Also, the lines PS201-2 and PS203-2 illustrate transitions of the detection values of the pressure sensors PS201 and PS203, respectively, in a case where the depressurization process is performed (Example). In the graph, a period of about 1 sec interposed between two vertical dashed lines indicates a period during which the depressurization process is performed (a period during which the opening/closing valve AV202 is opened). In FIG. 7, a period on the left side of the section PR corresponds to the end of the pressurization process (normal pressurization step), and a period on the right side of the section PR corresponds to the beginning of the circulation process. From the graph of FIG. 7, it can be found that by carrying out the depressurization process for about 1 sec, the upstream pressure of the opening/closing valves AV204 and AV205 is reduced by about 2 Mpa.

According to the above-mentioned embodiment, by carrying out the depressurization process, it is possible to significantly reduce the amount of particles present on the surface of the wafer W after the supercritical drying process. According to experiments, it has been confirmed that by carrying out the depressurization process, compared to when the depressurization process is not performed, the amount of particles larger than 19 nm may be reduced to several hundreds of pieces (the numerical ratio may be reduced to about ⅓ to ¼). In many cases, when $CO_2$ is supplied by using a bar nozzle during the circulation process, particles are generated concentratedly on one side (left or right side) of the wafer W, but it has been confirmed that such biased generation of particles also does not occur.

[First Modified Embodiment of Depressurization Process and Pressurization Process]

In the above-described embodiment, the pressurization process is continued until the pressure inside the processing container 311 is increased to a supercritical state guarantee pressure (16 MPa), and then is followed by the circulation process, but the present disclosure is not limited thereto.

That is, the normal pressurization step of the pressurization process may be composed of a first normal pressurization step (first process) and a second normal pressurization step (second process). In the first normal pressurization step, $CO_2$ is supplied into the processing container 311 via the first supply line 234 and the first fluid ejector 321 such that the pressure inside the processing container 311 is gradually increased to an appropriate pressure higher than a critical pressure (about 8 MPa) and lower than a supercritical state guarantee pressure (16 MPa), and thereafter, in the second normal pressurization step, $CO_2$ is supplied into the processing container 311 via the second supply line 236 and the second fluid ejector 322 such that the pressure inside the processing container 311 is gradually increased to a supercritical state guarantee pressure. Then, the depressurization process (density adjustment process) may be performed between the first normal pressurization step and the second normal pressurization step. The state of each opening/closing valve in the first normal pressurization step may be the same as that in the normal pressurization step in the above-described embodiment. Also, the state of each opening/closing valve in the second normal pressurization step may be the same as that in the normal pressurization step in the above-described embodiment except that the opening/closing valve AV203 is closed and the opening/closing valves AV204 and AV205 are opened. The depressurization process may be performed in the same procedure as the depressurization process of the above-described embodiment (this is performed between the pressurization process and the circulation process). The depressurization process in this modified embodiment may also be carried out such that the pressure in the upstream region closest to the opening/closing valves AV204 and AV205 is higher than the pressure inside the processing container 311 by 2 MPa or less, preferably by 1 MPa or less.

As described above, when the normal pressurization step of the pressurization process is divided into the first normal pressurization step (first process) and the second normal pressurization step (second process), and the depressurization process (density adjustment process) is performed between the first normal pressurization step and the second normal pressurization step, after the second normal pressurization step ends (the supercritical state guarantee pressure is reached), the discharge of $CO_2$ from the processing container 311 through the fluid discharge portion 324 may be started, and transition to the circulation process may be performed.

As described above, the particle reduction effect may be increased by quickly switching an ejector that ejects $CO_2$ into the processing container 311 from the first fluid ejector 321 to the second fluid ejector 322, and performing the depressurization process (density adjustment process) at the time of switching. That is, at the point in time when the ejection from the second fluid ejector 322 is started, the pressure inside the processing container 311 is relatively low, and thus, the pressure in the second fluid ejector 322 (bar nozzle) is also low. This suppresses dissolution of contaminants in the second fluid ejector 322, and thus contaminants contained in $CO_2$ ejected from the second fluid ejector 322 may be reduced. The pressurization process may be performed in a short time because after the pressure inside the processing container 311 exceeds the critical pressure, $CO_2$ is supplied into the processing container 311 from the second fluid ejector 322 capable of ejecting $CO_2$ at a relatively large flow rate.

[Second Modified Embodiment of Depressurization Process and Pressurization Process]

The density of supercritical $CO_2$ also varies depending on the temperature, and the higher the temperature, the lower the density of supercritical $CO_2$. Thus, at the timing when the depressurization process is carried out, instead of the depressurization process or in addition to the depressurization process, the supercritical $CO_2$ present in the upstream region of the opening/closing valves AV204 and AV205 may be heated by a heater. Accordingly, immediately after the pressurization process starts, the temperature of supercritical $CO_2$ flowing into the pipe **322*a* becomes higher than the temperature of supercritical $CO_2$ present in the processing container 311. That is, immediately after the pressurization process starts, the density of supercritical $CO_2$ flowing into the pipe 322*a* becomes lower than the density of supercritical $CO_2$ present in the processing container 311**. As described above, the solubility of contaminants is positively correlated with the density of the solvent (supercritical $CO_2$). Thus, for this, wafer contamination caused by the above-mentioned mechanism may be suppressed. Since the density of supercritical $CO_2$ is inversely proportional to the absolute temperature, a higher particle suppression effect is obtained by changing the pressure in the practical temperature range (about 80° C. to 120° C.) in the supercritical drying process. However, the density adjustment may be performed only by adjusting the temperature of supercritical $CO_2$, so as to obtain the particle suppression effect. Also, the density adjustment may also be performed by performing the depressurization as well as the temperature adjustment of supercritical $CO_2$, so as to increase the particle suppression effect.

Figure 8:
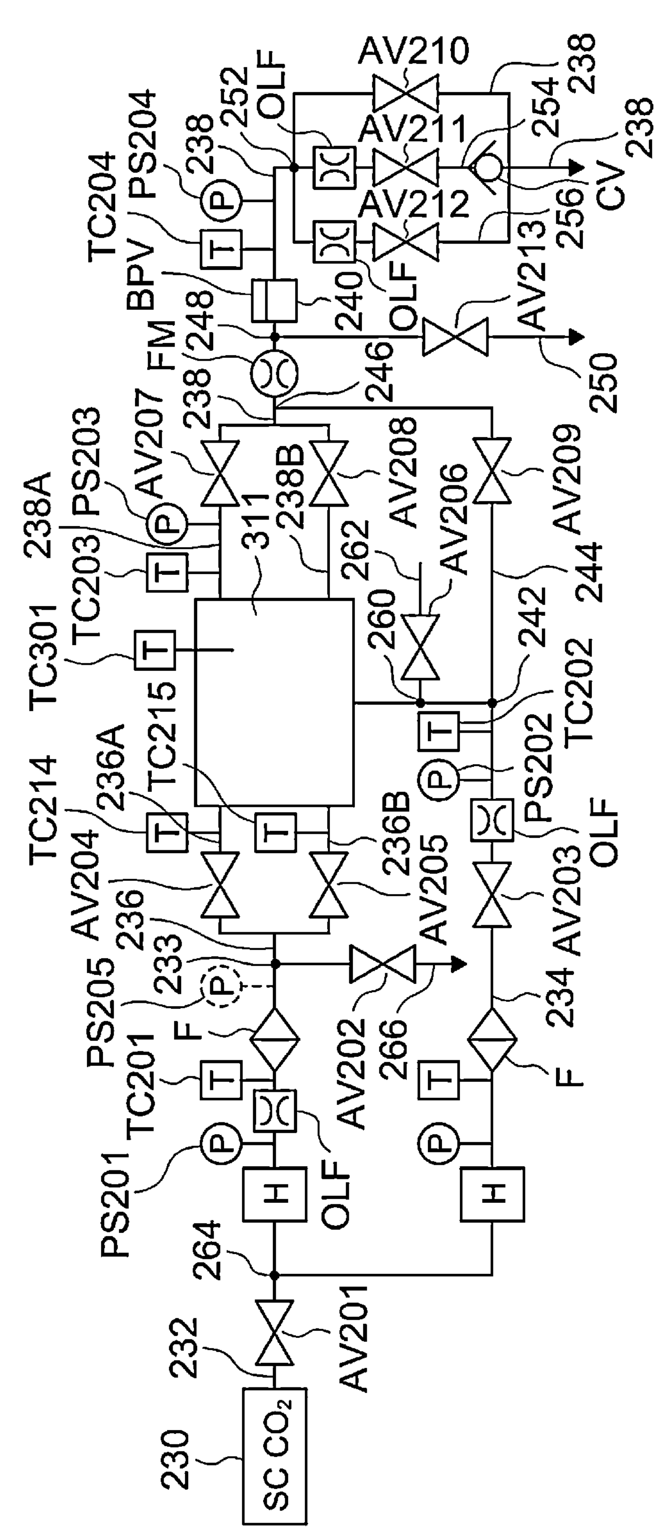
FIG. 8 is a piping system diagram according to one modified embodiment.
Figure 9:
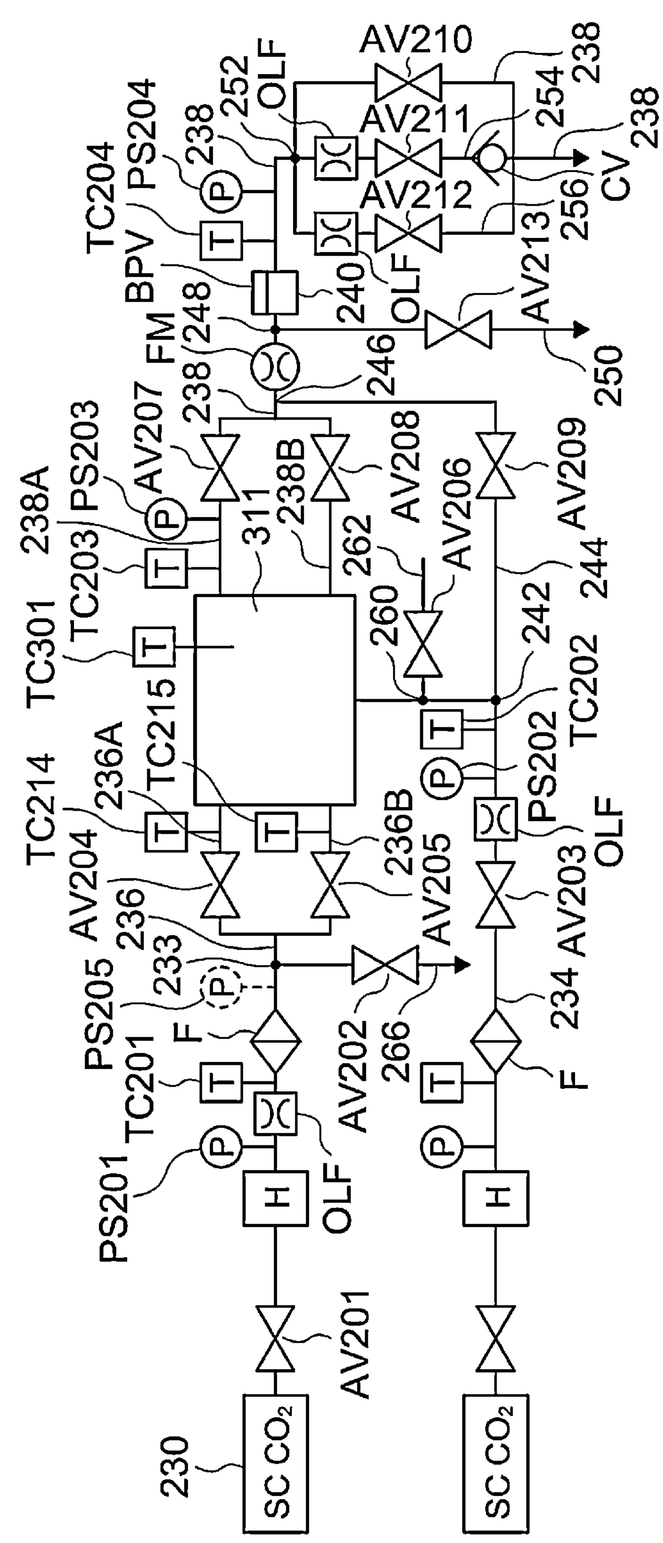
FIG. 9 is a piping system diagram according to another modified embodiment.

In carrying out the second modified embodiment, it is desirable that the temperature of $CO_2$ flowing into the processing container 311 via the first supply line 234, and the temperature of $CO_2$ flowing into the processing container 311 via the second supply line 236 may be independently adjusted. For this reason, as illustrated in FIG. 8, a heater H may not be provided in the main supply line 232, and instead, it is desirable to provide heaters H in the first supply line 234 and the second supply line 236 diverging from the main supply line 232, respectively. Alternatively, as illustrated in FIG. 9, the first supply line 234 and the second supply line 236 may not diverge from the main supply line 232, and instead, the first supply line 234 and the second supply line 236 may be provided independently of each other and heaters H may be provided in the first supply line 234 and the second supply line 236, respectively. In this case, supercritical fluid supply devices may be provided in the first supply line 234 and the second supply line 236, respectively.

Since it is desirable to perform the temperature adjustment for $CO_2$ present at a position near the opening/closing valves AV204 and AV205, a pipe-wrap type heater such as a ribbon heater, or a pipe-embedded type heater may be provided in the pipe immediately upstream of the opening/closing valves AV204 and AV205. Also, a buffer tank equipped with a heater may be provided in the pipe immediately upstream of the opening/closing valves AV204 and AV205, and $CO_2$ heated in the buffer tank may be sent immediately after the opening/closing valves AV204 and AV205 are opened.

In the piping system diagrams according to the modified embodiment illustrated in FIG. 8 and FIG. 9, when the density adjustment is performed only by temperature adjustment, the exhaust line 266 and the opening/closing valve AV203 may not be provided.

Even when the density adjustment is performed only by the depressurization, the piping configurations of FIG. 8 and FIG. 9 may also be used.

Figure 10:
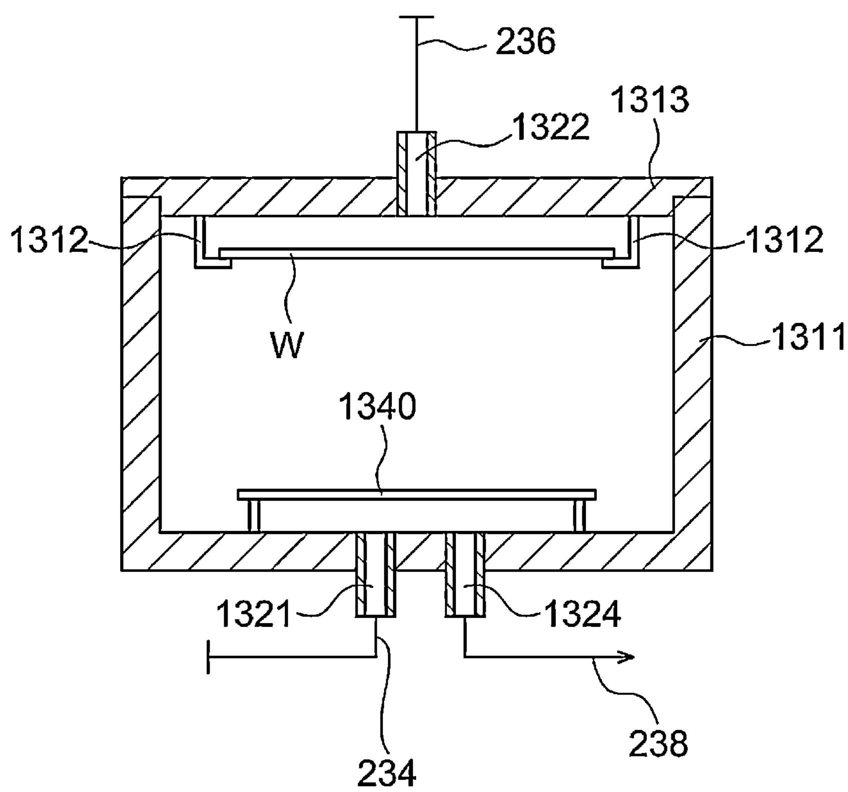
FIG. 10 is a schematic longitudinal sectional view illustrating one modified embodiment of the supercritical drying unit.

The configuration of the processing container 311 is not limited to those illustrated in FIG. 3 and FIG. 4, and, for example, a configuration illustrated in FIG. 10 may be adopted. In the modified embodiment of FIG. 10, a member having the same last three digits as the member illustrated in FIG. 3 and FIG. 4 is a member performing the same function. As for the supply/discharge system connected to a processing container 1311 of FIG. 10, the system illustrated in FIG. 5, FIG. 8, and FIG. 9 may be used as it is. The modified embodiment illustrated in FIG. 10 works as follows. That is, in the pressurization process, $CO_2$ is supplied into the processing container 1311 via the first supply line 234 and a first fluid ejector 1321. Immediately after being ejected from the first fluid ejector 1321, $CO_2$ collides with a baffle plate 1340, and does not flow directly toward the wafer W. In the circulation process, $CO_2$ is supplied into the processing container 1311 via the second supply line 236 and a second fluid ejector 1322. The second fluid ejector 1322 is provided above the wafer W held in a horizontal position by a wafer holder 1312, and ejects $CO_2$ toward the surface of the wafer W. This $CO_2$ is discharged from the processing container 1311 through a fluid discharge portion 1324.

In the modified embodiment illustrated in FIG. 10 as well, in switching from the pressurization process (or the first process) to the circulation process (or the second process), the depressurization process (density adjustment process) is performed so that particles may be reduced by the same mechanism as that described above.

According to the above-described embodiment of the present disclosure, it is possible to reduce the particle level on a substrate after supercritical drying.

From the foregoing content, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:

a processing container configured to process a substrate using a processing fluid in a supercritical state;

a processing fluid supply configured to supply the processing fluid to the processing container; and a controller, wherein the processing fluid supply includes:

a first fluid ejector that ejects the processing fluid into the processing container, a second fluid ejector that ejects the processing fluid into the processing container, a first supply line that supplies the processing fluid to the first fluid ejector, a first opening/closing valve provided in the first supply line, a second supply line that supplies the processing fluid to the second fluid ejector, a second opening/closing valve provided in the second supply line, and a density adjustor that adjusts a density of the processing fluid present on an upstream side of the second opening/closing valve in the second supply line, and the controller is configured to control the substrate processing apparatus to execute:

at least a first process in which the first opening/closing valve is opened and the second opening/closing valve is closed to supply the processing fluid to the first fluid ejector through the first supply line in a first period until a pressure in the processing container is increased and the processing fluid in the processing container reaches a supercritical state after supplying of the processing fluid to the processing container is started, at least a second process in which the first opening/closing valve is closed and the second opening/closing valve is opened to supply the processing fluid to the second fluid ejector through the second supply line at a flow rate larger than a flow rate of the processing fluid supplied to the first fluid ejector from the first supply line in the first period, in a second period after the processing fluid in the processing container has reached the supercritical state, and a density adjustment process in which after ending of the first process and before starting of the second process, the density adjustor makes a difference between an intra-line density and an intra-container density smaller than a predetermined threshold, the intra-line density being defined as a density of the processing fluid present in an upstream region of the second opening/closing valve in the second supply line, and the intra-container density being defined as a density of the processing fluid present in the processing container.

2. The substrate processing apparatus according to claim 1, wherein the density adjustor includes a pressure adjustor, and the controller is configured such that in the density adjustment process, the pressure adjustor makes a difference between an intra-line pressure and an intra-container pressure smaller than a predetermined threshold, thereby making the difference between the intra-line density and the intra-container density smaller than the predetermined threshold, the intra-line pressure being defined as a pressure of the processing fluid present in the upstream region of the second opening/closing valve in the second supply line, and the intra-container pressure being defined as a pressure of the processing fluid present in the processing container.

3. The substrate processing apparatus according to claim 2, wherein the controller is configured such that in the density adjustment process, the second opening/closing valve is opened to start the second process when the intra-line pressure is larger than the intra-container pressure, and the difference between the intra-line pressure and the intra-container pressure becomes less than 2 MPa.

4. The substrate processing apparatus according to claim 3, wherein the pressure adjustor includes:

a degassing line connected to the upstream region of the second opening/closing valve in the second supply line, and a degassing opening/closing valve provided in the degassing line, and the controller is configured such that in the density adjustment process, in a state where the first opening/closing valve and the second opening/closing valve are closed, the degassing opening/closing valve is opened and then the intra-line pressure is reduced, thereby making the intra-line pressure larger than the intra-container pressure and making the difference between the intra-line pressure and the intra-container pressure less than 2 MPa.

5. The substrate processing apparatus according to claim 4, further comprising:

a main supply line connected to a supercritical processing fluid supply source, wherein the first supply line and the second supply line diverge from the main supply line at a branch point set on the main supply line, and the degassing line is connected to the main supply line at an upstream position of the branch point or is connected to the second supply line between the branch point and the second opening/closing valve.

6. The substrate processing apparatus according to claim 4, wherein the first supply line and the second supply line are connected to a supercritical processing fluid supply source, and the degassing line is connected to the second supply line at an upstream position of the second opening/closing valve.

7. The substrate processing apparatus according to claim 1, wherein the density adjustor includes a temperature adjustor, and the controller is configured such that in the density adjustment process, the temperature adjustor makes a difference between an intra-line temperature and an intra-container temperature smaller than a predetermined threshold, thereby making the difference between the intra-line density and the intra-container density smaller than the predetermined threshold, the intra-line temperature being defined as a temperature of the processing fluid present in the upstream region of the second opening/closing valve in the second supply line, and the intra-container temperature being defined as a temperature of the processing fluid present in the processing container.

8. The substrate processing apparatus according to claim 7, wherein the temperature adjustor includes a heater provided in the upstream region of the second opening/closing valve in the second supply line.

9. The substrate processing apparatus according to claim 1, wherein the controller is configured such that, when the pressure in the processing container has reached a first pressure higher than a critical pressure of the processing fluid, the first process is ended, then the density adjustment process is performed, and subsequently the second process is performed, and in the second process, the pressure in the processing container is increased to a second pressure higher than the first pressure.

10. The substrate processing apparatus according to claim 1, further comprising:

a substrate holder configured to horizontally hold a substrate having a liquid film formed on a surface thereof with the surface facing upwards within the processing container, wherein the first fluid ejector is provided to eject the processing fluid into the processing container from below the substrate held by the substrate holder, and the second fluid ejector is provided to eject the processing fluid into the processing container from a lateral side of the substrate held by the substrate holder.

11. A substrate processing method comprising:

providing a substrate processing apparatus including:

a processing container configured to process a substrate using a processing fluid in a supercritical state;

a processing fluid supply that supplies the processing fluid to the processing container; and a controller, wherein the processing fluid supply includes:

a first fluid ejector that ejects the processing fluid into the processing container, a second fluid ejector that ejects the processing fluid into the processing container, a first supply line that supplies the processing fluid to the first fluid ejector, a first opening/closing valve provided in the first supply line, a second supply line that supplies the processing fluid to the second fluid ejector, a second opening/closing valve provided in the second supply line, and a density adjustor that adjusts a density of the processing fluid present on an upstream side of the second opening/closing valve in the second supply line;

executing at least a first process in which the first opening/closing valve is opened and the second opening/closing valve is closed to supply the processing fluid to the first fluid ejector through the first supply line in a first period until a pressure in the processing container is increased and the processing fluid in the processing container reaches a supercritical state after supplying of the processing fluid to the processing container is started, executing at least a second process in which the first opening/closing valve is closed and the second opening/closing valve is opened to supply the processing fluid to the second fluid ejector through the second supply line at a flow rate larger than a flow rate of the processing fluid supplied to the first fluid ejector from the first supply line in the first period, in a second period after the processing fluid in the processing container has reached the supercritical state, and executing a density adjustment process in which after ending of the first process and before starting of the second process, the density adjustor makes a difference between an intra-line density and an intra-container density smaller than a predetermined threshold, the intra-line density being defined as a density of the processing fluid present in an upstream region of the second opening/closing valve in the second supply line, and the intra-container density being defined as a density of the processing fluid present in the processing container.

12. The substrate processing method according to claim 11, wherein the density adjustor includes a pressure adjustor, and in the density adjustment process, the pressure adjustor makes a difference between an intra-line pressure and an intra-container pressure smaller than a predetermined threshold, thereby making the difference between the intra-line density and the intra-container density smaller than the predetermined threshold, the intra-line pressure being defined as a pressure of the processing fluid present in the upstream region of the second opening/closing valve in the second supply line, and the intra-container pressure being defined as a pressure of the processing fluid present in the processing container.

13. The substrate processing method according to claim 12, wherein in the density adjustment process, the second opening/closing valve is opened to start the second process when the intra-line pressure is larger than the intra-container pressure, and the difference between the intra-line pressure and the intra-container pressure becomes less than 2 MPa.

14. The substrate processing method according to claim 13, wherein the pressure adjustor includes:

a degassing line connected to the upstream region of the second opening/closing valve in the second supply line, and a degassing opening/closing valve provided in the degassing line, and in the density adjustment process, in a state where the first opening/closing valve and the second opening/closing valve are closed, the degassing opening/closing valve is opened and then the intra-line pressure is reduced, thereby making the intra-line pressure larger than the intra-container pressure and making the difference between the intra-line pressure and the intra-container pressure less than 2 MPa.

15. The substrate processing method according to claim 14, wherein the substrate processing apparatus further includes a main supply line connected to a supercritical processing fluid supply source, and the first supply line and the second supply line diverge from the main supply line at a branch point set on the main supply line, and the degassing line is connected to the main supply line at an upstream position of the branch point or is connected to the second supply line between the branch point and the second opening/closing valve.

16. The substrate processing method according to claim 14, wherein the first supply line and the second supply line are connected to a supercritical processing fluid supply source, and the degassing line is connected to the second supply line at an upstream position of the second opening/closing valve.

17. The substrate processing method according to claim 11, wherein the density adjustor includes a temperature adjustor, and in the density adjustment process, the temperature adjustor makes a difference between an intra-line temperature and an intra-container temperature smaller than a predetermined threshold, thereby making the difference between the intra-line density and the intra-container density smaller than the predetermined threshold, the intra-line temperature being defined as a temperature of the processing fluid present in the upstream region of the second opening/closing valve in the second supply line, and the intra-container temperature being defined as a temperature of the processing fluid present in the processing container.

18. The substrate processing method according to claim 17, wherein the temperature adjustor includes a heater provided in the upstream region of the second opening/closing valve in the second supply line.

19. The substrate processing method according to claim 11, wherein, when the pressure in the processing container has reached a first pressure higher than a critical pressure of the processing fluid, the first process is ended, then the density adjustment process is performed, and subsequently the second process is performed, and in the second process, the pressure in the processing container is increased to a second pressure higher than the first pressure.

20. The substrate processing method according to claim 11, wherein the substrate processing apparatus further includes a substrate holder configured to horizontally hold a substrate having a liquid film formed on a surface thereof with the surface facing upwards within the processing container, the first fluid ejector is provided to eject the processing fluid into the processing container from below the substrate held by the substrate holder, and the second fluid ejector is provided to eject the processing fluid into the processing container from a lateral side of the substrate held by the substrate holder.

* * * * *